United States Patent
Kawabe et al.

Patent Number: 5,529,881
Date of Patent: Jun. 25, 1996

[54] POSTIVE PHOTORESIST COMPOSITION

[75] Inventors: Yasumasa Kawabe; Kenichiro Sato; Toshiaki Aoai; Kazuya Uenishi, all of Shizuoka, Japan

[73] Assignee: Fuji Photo Film Co., Ltd., Kanagawa, Japan

[21] Appl. No.: 404,985

[22] Filed: Mar. 16, 1995

[30] Foreign Application Priority Data

Mar. 17, 1994 [JP] Japan .................. 6-047327

[51] Int. Cl.$^6$ .............. G03F 7/023; G03F 7/30
[52] U.S. Cl. ............ 430/191; 430/165; 430/192; 430/193
[58] Field of Search ............... 430/192, 193, 430/165, 191

[56] References Cited

U.S. PATENT DOCUMENTS

| | | | |
|---|---|---|---|
| 4,123,279 | 2/1978 | Kobayashi | 430/192 |
| 5,178,986 | 1/1993 | Zampini et al. | 430/190 |
| 5,407,778 | 4/1995 | Uetani et al. | 430/192 |
| 5,429,095 | 7/1995 | Tan et al. | 430/192 |

*Primary Examiner*—John S. Y. Chu
*Attorney, Agent, or Firm*—Sughrue, Mion, Zinn, Macpeak & Seas

[57] ABSTRACT

A positive photoresist composition for super fine working is disclosed, which comprises (a) an alkali-soluble resin and (b) as a photosensitive compound the 1,2-naphthoquinonediazido-5-(and/or -4-)sulfonic acid ester of a polyhydroxy compound represented by formula (I) or (II), wherein in a high-speed liquid chromatography measured using a ultraviolet ray of 254 nm, the pattern of the diester component and the pattern of the complete ester component of said 1,2-naphthoquinonediazido-5-(and/or -4-)sulfonic acid of the polyhydroxy compound shown by formula (I) or (II) are at least 50% and less than 40%, respectively, of the whole pattern areas;

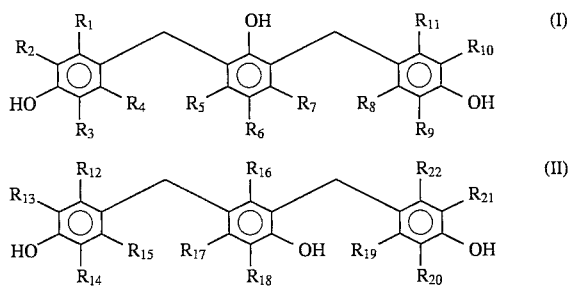

wherein $R_1$ to $R_{11}$, which may be the same or different, each represents a hydrogen atom, a halogen atom, an alkyl group, an alkoxy group, or a cycloalkyl group, with the proviso that at least one of $R_1$ to $R_{11}$ is a cycloalkyl group, and $R_{12}$ to $R_{22}$, which may be the same or different, each represents a hydrogen atom, a halogen atom, an alkyl group, an alkoxy group, or a cycloalkyl group, with the proviso that at least one of $R_{12}$ to $R_{22}$ is a cycloalkyl group. The photoresist composition has a high resolving power and a less layer thickness reliance of the resolving power, and a wide development latitude, is reluctant to form a development residue, and further has a very excellent storage stability, and does not deposit the photosensitive material and does not form microgels with the passage of time.

8 Claims, No Drawings

POSTIVE PHOTORESIST COMPOSITION

FIELD OF THE INVENTION

The present invention relates to a positive photoresist composition containing an alkali-soluble resin and a specific 1,2-quinonediazide compound and sensitive to radiations such as ultraviolet rays, far-ultraviolet rays, X-rays, electron beams, molecular beams, γ-rays, synchrotron radiations, etc., and, more specifically, to a positive photoresist for fine working, which gives a high resolving power regardless of the fluctuation of the layer thickness, gives less occurrence of a development residue, is excellent in the development latitude, and has a good stability with the passage of time.

The positive photoresist of the present invention is coated on a substrate such as a semiconductor wafer, a glass plate, a ceramic sheet, a metal foil, etc., at a thickness of from 0.5 to 2 μm by a spin coating method or a roller coating method. Thereafter, the coated layer is dried by heating, a circuit pattern, etc., is printed thereon by the irradiation of ultraviolet rays, etc., through an exposure mask, and after, if necessary, applying thereto baking, the exposed layer is developed to form positive images.

Furthermore, by etching the substrate using the positive images as a mask, a pattern-form working can be applied onto the substrate. As typical application fields, there are the production steps of semiconductor devices such as IC, etc., the production steps of circuit substrates for a liquid crystal, a thermal head, etc., photofabrication steps, etc.

BACKGROUND OF THE INVENTION

As a positive photoresist composition, a composition containing an alkali-soluble resin binder such as novolac resin, etc., and a naphthoquinonediazide compound as a photosensitive material is generally used.

Since the novolac resin as the binder is soluble in an aqueous alkali solution without being swelled therewith and also when the images formed are used as a mask for etching, the resin gives a high durability to the images against plasma etching, the novolac resin is particularly useful for the use of the present invention.

Also, the naphthoquinonediazide compound being used as the photosensitive material is a unique material in the point that the compound itself functions as a dissolution inhibitor for lowering the alkali solubility of a novolac resin but when the compound is decomposed by irradiated with light, an alkali-soluble material is formed to rather increase the alkali solubility of the novolac resin, and owing to the large change of the property by the action of light, the naphthoquinonediazide compound is particularly useful as the photosensitive material for a positive photoresist.

Hitherto, from such view points, many positive photoresists each containing the novolac resin and the naphthoquinonediazide series resin have been developed and practically used. In particular, the progress of the resist materials toward a high resolving power is remarkable and sufficient results have obtained in line width working up to submicrons.

Hitherto, for increasing the resolving power and obtaining an image reproduction of good pattern form, a resist having a high contrast (γ value) has been considered to be useful and the technical development of resist compositions meeting such a purpose has been made. There are many publications disclosing such techniques. In particular, in regard to the novolac resin which is the main portion of positive photoresist, there are many patent applications on the monomer components, the molecule weight distributions, the synthesis methods, etc., and good results have been obtained. Also, in regard to the photosensitive material which is another main component in the present invention, compounds of many structures which are effective in obtaining a high contrast are disclosed. When a positive photoresist is prepared by utilizing these techniques, it has been able to develop a superhigh resolving power resist which can resolve a pattern of the dimension in the same degree as that of the wavelength of light.

However, an integrated circuit has more and more increased the integrated degree and in the production of a semiconductor substrate such as a very large scale integrated circuit (VLSI), etc., it has become necessary to work a ultra fine pattern composed of a line width such as 0.5 μm or thinner. In such a use, a photoresist which stably obtains particularly high resolving power and has a wide development latitude for always ensuring a constant worked line width has been required. Also, it has been required that a resist residue does not form on the pattern of the resist after development for preventing the working defect of the circuit formed.

Also, in the formation of, in particular, a ultra fine pattern of 0.5 μm or thinner, it has been found that, for example, even when a definite resolving power is obtained by a certain coated layer thickness, there is a phenomenon of deteriorating the resolving power obtained by slightly changing only the coated layer thickness (hereinafter, the phenomenon is referred to as "layer thickness reliance"). Astonishingly, it has also been found that even when the layer thickness slightly changes only several μm-hundredths, the resolving power is largely changed and any typical positive photoresists commercially available at present have such a tendency more or less. Practically, when the thickness of the resist layer before light exposure changes in the range of λ/4n (wherein λ is an exposure wavelength and n is the refractive index of the resist layer in the wavelength) to a definite layer thickness, the resolving power obtained thereby fluctuates.

As to the problem of the layer thickness reliance, the existence is indicated, e.g., by *SPIE Proceedings*, Vol. 1925, 626(1993) and it is described therein that the existence of the layer thickness reliance is caused by the multilayer reflection effect of light in the resist layer.

It has been found that when, in particular, the contrast of the resist is increased for obtaining a pattern having a high resolving power and a rectangular cross sectional form, the layer thickness reliance is frequently increased. In the case of practically working a semiconductor substrate, a pattern is formed using a resist layer coated with a finely different layer thickness per positions by the unevenness of the surface of the substrate and the unevenness of the coated layer thickness. Accordingly, in the case of practicing fine working near the limit of the resolution using a positive photoresist, the layer thickness reliance has been one of hindrances.

Hitherto, for increasing the resolving power, many 1,2,-naphthoquinonediazide compounds of polyhydroxy compounds having specific structures are proposed. For example, these compound are disclosed in JP-A-57-63526, JP-A-60-163043, JP-A-62-10645, JP-A-62-10646, JP-A-62-150245, JP-A-63-220139, JP-A-64-76047, JP-A-1-189644, JP-A-2-285351, JP-A-2-296248, JP-A-2-296249, JP-A-3-48249, JP-A-3-48250, JP-A-3-158856, and JP-A-3-228057 (the term "JP-A" as used herein means an "unexamined published Japanese patent application"), Patent Kohyo (PCT Japanese patent unexamined publication) No. 4-502519, U.S. Pat. Nos. 4,957,846, 4,992,356, 5,151,340, and 5,178,986, European Patent 530,148, etc.

However, even by using these photosensitive materials, the positive photoresists are yet insufficient in the view point of the reduction of the layer thickness reliance.

On the other hand, it is described, e.g., in JP-B-37-18015 (the term "JP-B" as used herein means an "examined Japanese patent publication"), JP-A-58-150948, JP-A-2-19846, JP-A-2-103543, JP-A-3-228057, and JP-A-5-323597, European Patent 573,056, U.S. Pat. Nos. 3,061,430, 3,130,047, 3,130,048, 3,130,049, 3,102,809, 3,184,310, 3,188,210, and 3,180,733, West German Patent 938,233, *SPIE Proceedings*, Vol. 631, page 210, ibid., Vol. 1672, 231(1992), ibid., Vol. 1672, 262(1992), and ibid., Vol. 1925, 227(1993) that by utilizing a photosensitive material having a hydroxy group in the molecule, a resist having a high contrast and a high resolving power is obtained.

The inventors previously proposed the selective esterified photosensitive materials having three aromatic rings shown by following formulae (III) (IV), and (V) (SPIE Proceedings, Vol. 1672, pages 262–272).

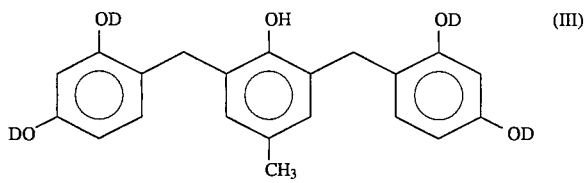

(III)

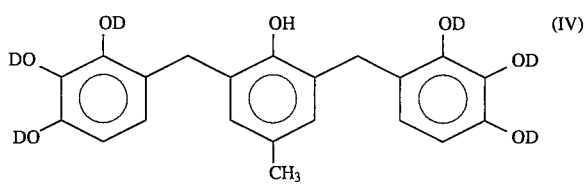

(IV)

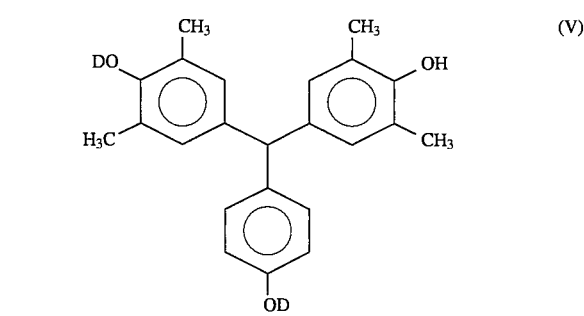

(V)

However, in these photosensitive materials, the resolving power was sufficiently increased but the layer thickness reliance was not sufficiently satisfactory. Also, JP-A-2-19846 and JP-A-2-103543 disclose the diesters of the polyhydroxy compounds having specific structures as shown by following formulae (VI), (VII), and (VIII) but when the layer thickness reliance was determined on these diester photosensitive materials, it was not yet satisfactory.

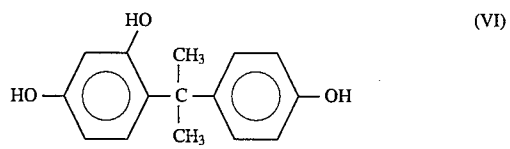

(VI)

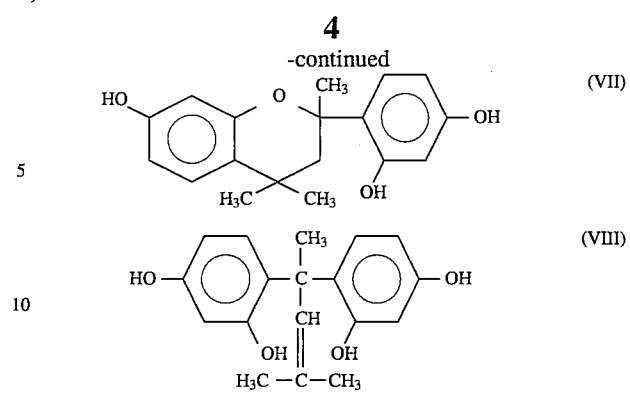

(VII)

(VIII)

Furthermore, for example, U.S. Pat. No. 5,178,986, JP-A-57-63526, and JP-A-62-10646 disclose the 1,2-naphthoquinonediazido-5-(and/or -4-)sulfonylchloride of the compounds shown by following formulae (IX) and (X), respectively, but the layer thickness reliance of these compounds were also not satisfactory.

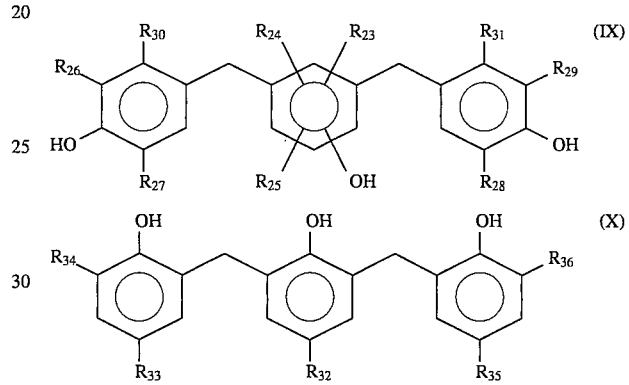

(IX)

(X)

wherein, $R_{23}$ to $R_{31}$, which may be the same or different, each represents a hydrogen atom, a halogen atom, an alkyl group having 1 to 4 carbon atoms, an alkoxy group having 1 to 4 carbon atoms, an aryl group, an aralkyl group, an allyl group, or a nitro group, and $R_{32}$ to $R_{36}$, which may be the same or different, each represents a hydrogen atom or an alkyl group having 1 to 10 carbon atoms.

As described above, the manner of designing the composition of a resist material for reducing the layer thickness reliance and obtaining a high resolving power regardless of the layer thickness has not hitherto been known.

Also, with the increase of the integration of a semiconductor device, the requirement of a positive photoresist for particles has been more and more increased. As the term "1/10 rule" is generally said in the field of semiconductor, the particles of the size of larger than 1/10 of the smallest line wide of a semiconductor device give a bad influence on the yield of the device (*Ultraclean Technology*, Vol. 3, No. 1, 79(1991), etc.).

For reducing the particles, a means of using a superfine filter having a pore size of from 0.1 μm to 0.05 μm, etc., has been made at the production of photoresists and the means is useful for reducing the particles in the production of photoresists.

However, even when, for example, particles are less at the production of photoresists, it frequently happens that particles are increased in photoresists with the passage of time. The increase of particles in the photoresists with the passage of time is almost caused by a 1,2-quinonediazide photosensitive material and various investigations have hitherto been made for preventing the increase of particles with the passage of time.

For example, a method of using a photosensitive material obtained by acylating or sulfonylating a part of hydroxy groups of a polyhydroxy compound as disclosed in JP-A-62-178562, a method of using a mixture of a 1,2-naphthoquinonediazido- 4-sulfonic acid ester and a 1,2-naphthoquinonediazido- 5-sulfonic acid ester as disclosed in JP-A-62-284354, a method of using a thermally denatured 1,2-naphthoquinonediazide photosensitive material as disclosed in JP-A-63-113451, a method of reducing the residual catalyst in a photosensitive material as disclosed in JP-A-63-236030, a method of synthesizing a photosensitive material in the presence of an anion-exchange resin as disclosed in JP-A-63-236031, a method of mixing a photosensitive material with a solvent having an excellent solubility for the photosensitive material as disclosed in JP-A-61-260239 and JP-A-1-293340), etc., has hitherto been tried.

SUMMARY OF THE INVENTION

The first object of the present invention is, therefore, to provide a positive photoresist composition for super fine working having a high resolving power and having a less layer thickness reliance of the resolving power. In addition, in the present invention, the term "layer thickness reliance" means the fluctuation of the resolving power of a photoresist obtained by light-exposing, (baking, if necessary), and developing the photoresist when the thickness of the photoresist layer before the light exposure changes in the range of λ/4n.

The second object of the present invention is to provide a positive photoresist having a wide development latitude and being reluctant to form a development residue. In this case, the development latitude can be shown by the development time reliance of a resist line width obtained by developing the photoresist or the temperature reliance of a developer. Also, the development residue means a slight amount of a resist insoluble matter remaining between the fine patterns after development, which can be observed by a scanning type electron microscope, etc.

The third object of the present invention is to provide a positive photoresist composition having a very excellent storage stability, which does not deposit the photosensitive material and does not form microgels with the passage of time, that is, does not show the increase of particles.

As the result of various investigations for achieving the objects described above, the present inventors have discovered that the foregoing objects can be achieved by using an alkali-soluble resin and a 1,2-quinonediazide compound having a specific skeleton structure, wherein the ratio of the hydroxy groups in the molecule to a 1,2-quinonediazido-5-(and/or -4-)sulfonic acid ester is in the specific range, and have accomplished the present invention based on the discovery.

That is, it has been found that the objects described above can be achieved by the present invention described herein below.

Thus, according to the present invention, there is provided a positive photoresist composition comprising an alkali-soluble resin and the 1,2-naphthoquinonediazido-5-(and/or -4-)sulfonate acid ester of a polyhydroxy compound represented by following formula (I) or (II), wherein in the high-speed liquid chromatography measured using a ultraviolet ray of 254 nm, the pattern of the diester component and the pattern of the complete ester component of the 1,2-naphthoquinonediazido- 5-(and/or -4-)sulfonic acid ester of the polyhydroxy compound represented by the formula (I) or (II) are at least 50% and less than 40%, respectively, of the whole pattern areas.

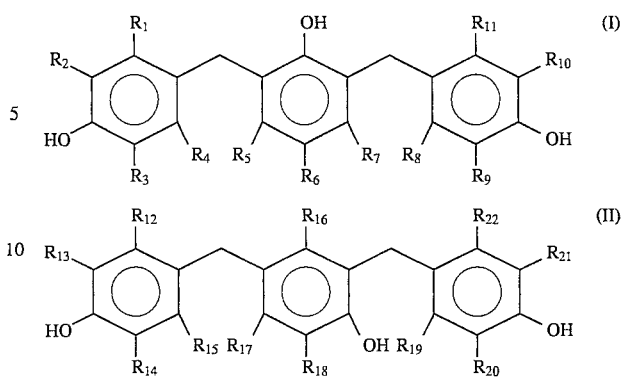

wherein $R_1$ to $R_{11}$, which may be the same or different, each represents a hydrogen atom, a halogen atom, an alkyl group, an alkoxy group, or a cycloalkyl group, with the proviso that at least one of them is a cycloalkyl group, and $R_{12}$ to $R_{22}$, which may be the same or different, each represents a hydrogen atom, a halogen atom, an alkyl group, an alkoxy group, or a cycloalkyl group, with the proviso that at least one of them is a cycloalkyl group.

DETAILED DESCRIPTION OF THE INVENTION

Then, the present invention is described in detail.

It has not yet been clarified why the resolving power is specifically increased, the layer thickness reliance becomes less, the development latitude becomes wide, the development residue becomes reluctant to form, and also the storage stability becomes very excellent by using the photosensitive material being used in the present invention, but it is considered that the specific effects or merits are obtained by the structural features of the photosensitive material that the material is the compound of (1) straight chain form, having (2) three aromatic rings, and having (3) one hydroxy group to each aromatic ring, and (4) the hydroxy groups at both the terminals thereof are disposed at the para-positions to the methylene bond and the compound is liable to be selectively esterified, and (5) the cycloalkyl group exists in the molecule.

Furthermore, in the structural features described above, it is considered that the existence of the cycloalkyl group contributes well to the storage stability of the photoresist but the existences of a straight chain or branched alkyl group having from 1 to 6 carbon atoms and an aryl group such as a phenyl group, etc., cannot sufficiently satisfy the storage stability of the photoresist. That is, it has been found that the foregoing features (1) to (4) are particularly effective for the improvement of the resolving power and the layer thickness reliance and the feature (5) is particularly effective for the storage stability. These facts have been unexpected by the conventional knowledge.

Then, the compound shown by formula (I) or (II) described above is described in detail.

In $R_1$ to $R_{11}$ and $R_{12}$ to $R_{22}$ of the formulae (I) and (II), respectively, as the halogen atom, chlorine, bromine or iodine is preferred and as the alkyl group, the alkyl group having from 1 to 4 carbon atoms such as methyl, ethyl, propyl, isopropyl, n-butyl, isobutyl, sec-butyl, or t-butyl is preferred, and methyl is particularly preferred. Also, as the alkoxy group, the alkoxy group having from 1 to 4 carbon atoms, such as methoxy, ethoxy, propoxy, isopropoxy, n-butoxy, isobutoxy, sec-butoxy, or t-butoxy is preferred and methoxy is particularly preferred. Also, as the cyloalkyl group, cyclopentyl or cylohexyl is preferred and cyclohexyl is particularly preferred.

Specific examples of the compounds shown by formula (I) and formula (II) are compounds [I-1] to [I-9] and compounds [II-1] and [II-9], respectively, shown below but the compounds of the formulae being used in the present invention are not limited by these compounds.

In addition, these polyhydroxy compounds can be used singly or as a mixture thereof.

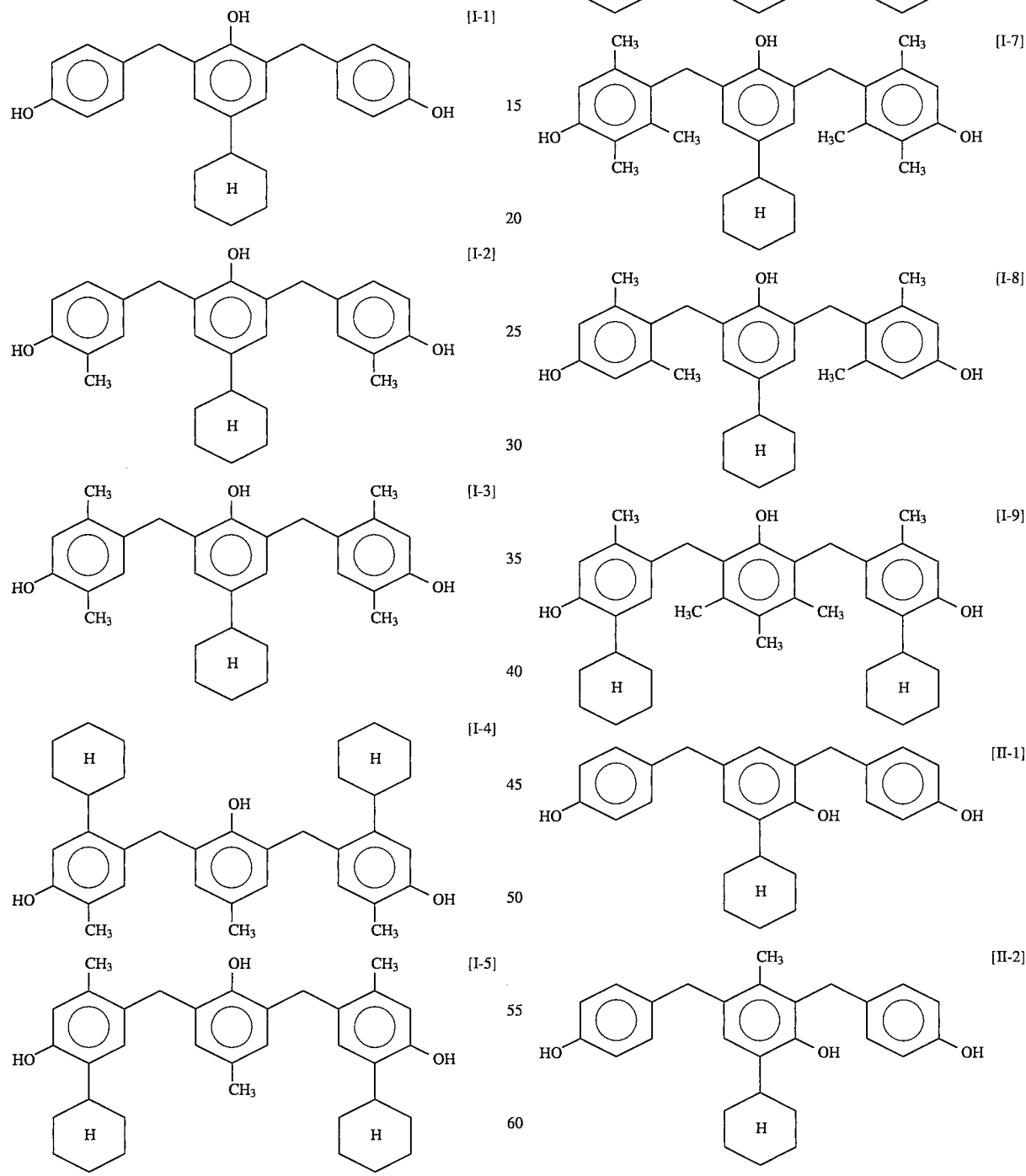

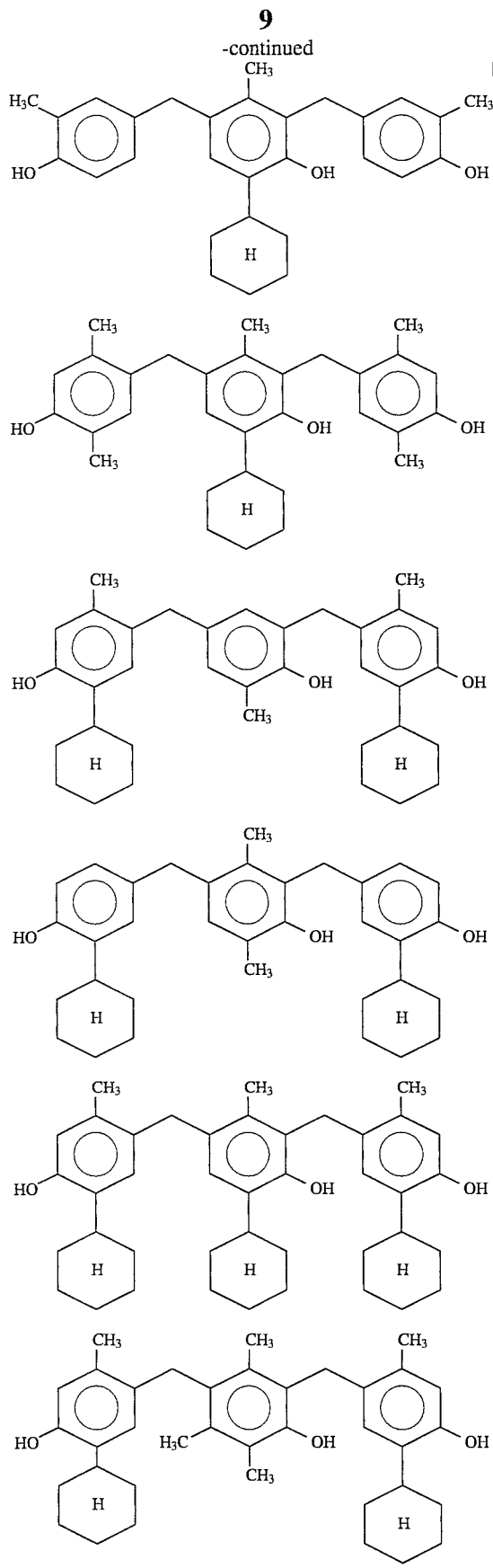

In the foregoing specific compounds, as the compounds giving the best effects to the objects of the present invention, the compounds shown by the formulae (I) and (II), wherein at least one of $R_5$ to $R_7$ and $R_{16}$ to $R_{18}$, respectively, is a cycloalkyl group, that is, the compounds [I-1], [I-2], [I-3], [I-7], [I-8], [II-1], [II-2], [II-3], [II-4], and [II-9] are particularly preferred.

The photosensitive material being used in the present invention is obtained by, for example, carrying out an esterification reaction of the foregoing polyhydroxy compound and 1,2-naphthoquinonediazido-5- (and/or -4-)sulfonyl chloride in the presence of a basic catalyst.

That is, a definite amount of the polyhydroxy compound and a definite amount of 1,2-naphthoquinonediazido-5-(and/or -4-)sulfonyl chloride are placed in a flask together with a solvent such as dioxane, acetone, tetrahydrofuran, methyl ethyl ketone, N-methylpyrrolidone, chloroform, trichloroethane, trichloroethylene, dichloroethane, γ-butyrolactone, etc., and a solution of a basic catalyst such as sodium hydroxide, sodium carbonate, sodium hydrogencarbonate, triethylamine, 4-dimethylaminopyridine, 4-methylmorpholine, N-methylpiperazine, N-methylpiperidine, etc., is added dropwise to the mixture to carry out the condensation reaction. The product obtained was crystallized in water, washed with water, further purified, and dried.

In an ordinary esterification reaction, a mixture having various different esterification numbers and esterified positions is obtained by using the polyhydroxy compound being used in the present invention, it is easy to selectively esterify the diester compound. However, it is necessary to control the reaction such that, in a high-speed chromatography, the pattern of the diester compound is at least 50% and the pattern of the complete substitution product is less than 40%, of the whole pattern areas. If the pattern area of the diester compound is less than 50% and the pattern area of the complete substitution product is at least 40%, the layer thickness reliance is large and the effect of the present invention is not obtained. It is preferred that the pattern area of the diester compound is at least 60% and the pattern area of the complete substitution product is less than 30% and it is more preferred that the pattern area of the diester compound is at least 70% and the pattern area of the complete substitution product is less than 20%.

For increasing the selectivity of the esterification reaction, in the basic catalysts described above, it is particularly preferred to use the aliphatic cyclic amine such as 4-methylmorpholine, N-methylpiperazine, N-methylpiperidine, etc.

If necessary, the 1,2-naphthoquinonediazido-5-sulfonic acid ester and the 1,2-naphthoquinonediazido-4-sulfonic acid ester can be used together. Also, the reaction temperature in the foregoing reaction is usually from −20° C. to 60° C., and preferably from 0° C. to 40° C.

When the photosensitive compounds of the present invention synthesized by the method described above are used as a resin composition, the photosensitive compounds are compounded with an alkali-soluble resin singly or as a mixture of two or more kinds thereof and the compounding amount of the photosensitive compound is from 5 to 100 parts by weight, and preferably from 20 to 60 parts by weight to 100 parts by weight of the alkali-soluble resin. If the compounding amount is less than 5 parts by weight, the percentage film remaining is greatly lowered and if the compounding amount is over 100 parts by weight, the sensitivity and the solubility in a solvent are lowered.

As the alkali-soluble resin being used in the present invention, there are a novolac resin, an acetone-pyrogallol resin, polyhydroxystyrene, and the derivatives thereof.

In these alkali-soluble resins, a novolac resin is particularly preferred and the novolac resin is obtained by subjecting a definite monomer as the main component to an aldehyde by addition polycondensation in the presence of an acid catalyst.

As the definite monomer, cresols such as phenol, m-cresol, p-cresol, o-cresol, etc.; xylenols such as 2,5-xylenol, 3,5-xylenol, 3,4-xylenol, 2,3-xylenol, etc.; alkylphenols such as m-ethylphenol, p-ethylphenol, o-ethylphenol, p-t-butylphenol, etc.; trialkylphenols such as 2,3,5-trimethylphenol, 2,3,4-trimethylphenol, etc.; alkoxyphenols such as p-methoxyphenol, m-methoxyphenol, 3,5-dimethoxyphenol, 2-methoxy-4-methylphenol, m-ethoxyphenol, p-ethoxyphenol, m-propoxyphenol, p-propoxyphenol, m-butoxyphenol, p-butoxyphenol, etc.; bisalkylphenols such as 2-methyl-4-isopropylphenol, etc.; and hydroxyaromatic compounds such as m-chlorophenol, p-chlorophenol, o-chlorophenol, dihydroxybiphenyl, bisphenol A, phenylphenol, resorcinol, naphthol, etc., can be used singly or as a mixture thereof although the monomer being used in the present invention is not limited to these monomers.

As the aldehydes being used for forming the novolac resin, for example, formaldehyde, para-formaldehyde, acetaldehyde, propylaldehyde, benzaldehyde, phenylacetaldehyde, α-phenylpropylaldehyde, β-phenylpropylaldehyde, o-hydroxybenzaldehyde, m-hydroxybenzaldehyde, p-hydroxybenzaldehyde, o-chlorobenzaldehyde, m-chlorobenzaldehyde, p-chlorobenzaldehyde, n-nitrobenzaldehyde, m-nitrobenzaldehyde, p-nitrobenzaldehyde, o-methylbenzaldehyde, m-methylbenzaldehyde, p-methylbenzaldehyde, p-ethylbenzaldehyde, p-n-butylbenzaldehyde, furfural, chloroacetaldehyde, and the acetal compounds thereof, such as chloroacetaldehyde diethyl acetal, etc., can be used., and in these compounds, formaldehyde is preferably used.

These aldehydes are used singly or as a mixture thereof.

As the acid catalyst for use in the addition polycondensation described above, hydrochloric acid, sulfuric acid, formic acid, acetic acid, oxalic acid, etc., can be used.

Also, the techniques disclosed in JP-A-60-45238, JP-A-60-97347, JP-A-60-140235, JP-A-60-189739, JP-A-64-14229, JP-A-1-276131, JP-A-2-60915, JP-A-2-275955, JP-A-2-282745, JP-A-4-101147, JP-A-4-122938, etc., that is, the novolac resins wherein low-molecular components were removed or reduced can be preferably used.

The weight-average molecular weight of the novolac resin thus obtained is preferably in the range of from 2,000 to 20,000. If the molecular weight is less than 2,000, the film reduction of the unexposed portions after development is large, while the molecular weight is over 20,000, the development speed is reduced. The particular preferred range of the average molecular weight is from 3,000 to 15,000. In this case, the weight-average molecular weight is defined by the polystyrene converted value of a gel permeation chromatography.

Also, the degree of dispersion (the ratio of a weight-average molecular weight Mw to a number-average molecular weight Mn, i.e., Mw/Mn) of a novolac resin is preferably from 1.5 to 7.0, and more preferably from 1.5 to 4.0. If the degree of dispersion is over 7, the effect of this invention that the layer thickness reliance is good is not obtained and of the degree of dispersion is less than 1.5, a high purifying step is required in the case of synthesizing the novolac resin, whereby the synthesis of the novolac resin is lacking in the reality for the practical use and is unsuitable.

In the present invention, the photosensitive material described above is used and, if necessary, the esterified product of the polyhydroxy compound shown below and 1,2-naphthoquinonediazido- 5-(and/or -4-)sulfonyl chloride can be used together.

In this case, the ratio of the naphthoquinonediazide ester photosensitive material of the polyhydroxy compound to the photosensitive material of the present invention is preferably from 20/80 to 80/20 (by weight ratio). That is, if the content of the photosensitive material of the present invention is less than 20% by weight based on the total amount of the photosensitive materials in the photoresist composition, the effect of the present invention cannot sufficiently be obtained.

Examples of the polyhydroxy compound are polyhydroxybenzophenones such as 2,3,4-trihydroxybenzophenone, 2,4,4'-trihydroxybenzophenone, 2,4,6-trihydroxybenzophenone, 2,3,4-trihydroxy-2'-methylbenzophenone, 2,3,4,4'-tetrahydroxybenzophenone, 2,2',4,4'-tetrahydroxybenzophenone, 2,4,6,3',4'-pentahydroxybenzophenone, 2,3,4,2',4'-pentahydroxybenzophenone, 2,3,4,2',5'-pentahydroxybenzophenone, 2,4,6,3',4',5'-hexahydroxybenzophenone, 2,3,4,3',4',5'-hexahydroxybenzophenone, etc.; polyhydroxyphenyl alkyl ketones such as 2,3,4-trihydroxyacetophenone, 2,3,4-trihydroxyphenyl pentyl ketone, 2,3,4-trihydroxyphenyl hexyl ketone, etc.; bis[(poly)hydroxyphenyl]alkanes such as bis(2,4-dihydroxyphenyl)methane, bis(2,3,4-trihydroxyphenyl)methane, bis(2,4-dihydroxyphenyl)propane-1, bis(2,3,4-trihydroxyphenyl)propane- 1, nordihydroguaiaretic acid, etc.; polyhydroxybenzoic acid esters such as propyl 3,4,5-trihydroxybenzoate, phenyl 2,3,4-trihydroxybenzoate, phenyl 3,4,5-trihydroxybenzoate, etc.; bis(polyhydroxybenzoyl)alkanes or bis(polyhydroxybenzoyl)aryls, such as bis(2,3,4-trihydroxybenzoyl)methane, bis(3-acetyl-4,5,6-trihydroxyphenyl)methane, bis(2,3,4-trihydroxybenzoyl)benzene, bis(2,4,6-trihydroxybenzoyl)benzene, etc.; alkylene-di-(polyhydroxy benzoates) such as ethylene glycol-di(3,5-dihydroxy benzoate), ethylene glycol-di( 3,4,5-trihydroxy benzoate), etc.; polyhydroxybiphenyls such as 2,3,4-biphenyltriol, 3,4,5-biphenyltriol, 3,5,3',5'-biphenyltetrol, 2,4,2',4'-biphenyltetrol, 2,4,6,3',5'-biphenylpentol, 2,4,6,2',4',6'-biphenylhexol, 2,3,4,2',3',4'-biphenylhexol, etc.; bis(polyhydroxy) sulfides such as 4,4'-thiobis( 1,3-dihydroxy)benzene, etc.; bis(polyhydroxyphenyl) ethers such as 2,2',4,4'-tetrahydroxy diphenyl ether, etc.; bis(polyhydroxyphenyl) sulfoxides such as 2,2',4,4'-tetrahydroxydiphenyl sulfoxide, etc.; bis(polyhydroxyphenyl) sulfones such as 2,2',4,4'-diphenyl sulfone, etc.; polyhydroxytriphenylmethanes such as tris(4-hydroxyphenyl)methane, 4,4',4"-trihydroxy-3,5,3',5'-tetramethyltriphenylmethane, 4,4',3",4"-tetrahydroxy- 3,5,3',5'-tetramethyltriphenylmethane, 4,4',2",3",4"-pentahydroxy- 3,5,3',5'-tetramethyltriphenylmethane, 2,3,4,2',3',4'-hexahydroxy-5.5'-diacetyltriphenylmethane, 2,3,4,2',3',4',3",4"-octahydroxy-5,5'-diacetyltriphenylmethane, 2,4,6,2',4',6'-hexahydroxy-5,5'-dipropionyltriphenylmethane, etc.; polyhydroxyspirobiindanes such as 3,3,3',3'-tetramethyl-1,1'-spirobiindane-5,6,5',6'-tetrol, 3,3,3',3'-tetramethyl-1,1'-spirobiindane- 5,6,7,5',6',7'-hexol, 3,3,3',3'-tetramethyl-1,1'-spirobiindane- 4,5,6,4',5',6'-hexol, 3,3,3',3'-tetramethyl-1,1'-spirobiindane-4,5,6,5',6',7'-hexol, etc.; polyhydroxy phthalides such as 3,3-bis(3,4-dihydroxyphenyl) phthalide, 3,3-bis(2,3,4-trihydroxyphenyl) phthalide, 3',4',5',6' -tetrahydroxyspiro[phthalido-3,9'-xanthene], etc.; flavono dyes such as morin, kersetin, rutin, etc.; the polyhydroxy compounds described in JP-A-4-253058, such as α,α',α"-tris(4-hydroxyphenyl) 1,3,5-triisopropylbenzene, α,α',α"-tris(3,5-dimethyl- 4-hydroxyphenyl) 1,3,5-triisopropylbenzene, α,α',α"-tris( 3,5-diethyl-4-hydroxyphenyl) 1,3,5-triisopropylbenzene, α,α',α"-(tris(3,5-di-n-propyl-4-hydroxyphenyl) 1,3,5-triisopropylbenzene, α,α',α"-tris(3,5-diisopropyl-4-hydroxyphenyl) 1,3,5-triisopropylbenzene, α,α',α"-tris(3,5-di-n-butyl- 4-hydroxyphenyl) 1,3,5-triisopropylbenzene, α,α',α"-tris(3-methyl-4-hydroxyphenyl) 1,3,5-triisopropylbenzene, α,α',α"-tris(3-methoxy-4-hydroxyphenyl) 1,3,5-triisopropylbenzene, α,α',α"-tris(2,4-dihydroxyphenyl) 1,3,5-triisopropylbenzene, 1,3,5-tris(3,5-dimethyl-4-hydroxyphenyl)benzene, 1,3,5-tris(5-methyl-2-hydroxyphenyl)benzene, 2,4,6-tris(3,5-dimethyl-4-hydroxyphenylthiomethyl)mesitylene, 1-[α-methyl-α-(4'-hydroxyphenyl)ethyl]-4-[α,α'-bis(4"-hydroxyphenyl)ethyl]benzene, 1-[α-methyl-α-(4'-hydroxyphenyl)ethyl]-3-[α,α'-bis(4"-hydroxyphenyl)ethyl]benzene, 1-[α-methyl-α-( 3',5'-dimethyl-4'-hydroxyphenyl)ethyl]-4-[α,α'-bis(3",5"-dimethyl- 4"-hydroxyphenyl)ethyl]benzene, 1-[α-methyl-α-(3'-methyl- 4'-hydroxyphenyl)ethyl]-4-[α',α'-bis(3"-methyl-4"-hydroxyphenyl)ethyl]benzene, 1-[α-methyl-α-(3'-methoxy-4"-hydroxyphenyl)ethyl]-4-[α',α'-bis(3"-methoxy-4"-hydroxyphenyl)ethyl]benzene, 1-[α-methyl-α-(2',4' -dihydroxyphenyl)ethyl]-4-[α',α'-bis(4"-hydroxyphenyl)ethyl]benzene, 1-[α-methyl-α-(2',4'-dihydroxyphenyl)ethyl]-3-[α",α'-bis(4"-hydroxyphenyl)ethyl]benzene, etc.; p-bis(2,3,4-trihydroxybenzoyl)benzene, p-bis(2,4,6-trihydroxybenzoyl)benzene, m-bis(2,3,4-trihydroxybenzoyl)benzene, m-bis(2,4,6-trihydroxybenzoyl)benzene, p-bis(2,5-dihydroxy-3-bromobenzoyl)benzene, p-bis(2,3,4-trihydroxy-5-methylbenzoyl)benzene, p-bis(2,3,4-trihydroxy-5-methoxybenzoyl)benzene, p-bis(2,3,4-trihydroxy-5-nitrobenzoyl)benzene, p-bis(2,3,4-trihydroxy-5-cyanobenzoyl)benzene, 1,3,5-tris(2,5-dihydroxybenzoyl)benzene, 1,3,5-tris(2,3,4-trihydroxybenzoyl)benzene, 1,2,3-tris(2,3,4-trihydroxybenzoyl)benzene, 1,2,4-tris(2,3,4-trihydroxybenzoyl)benzene, 1,2,4,5-tetrakis(2,3,4-trihydroxybenzoyl)benzene, α,α'-bis(2,3,4-trihydroxybenzoyl)-p-xylene, α,α',α'-tris(2,3,4-trihydroxybenzoyl)mesitylene, 2,6-bis-(2'-hydroxy-3',5'-dimethylbenzyl)-p-cresol, 2,6-bis( 2'-hydroxy-5'-methylbenzyl)-p-cresol, 2,6-bis(2'-hydroxy- 3',5'-di-t-butylbenzyl)-p-cresol, 2,6-bis(2'-hydroxy-5'-ethylbenzyl)-p-cresol, 2,6-bis(2',4'-dihydroxybenzyl)-p-cresol, 2,6-bis-(2',3'-hydroxy-3'-t-butyl-5'-methylbenzyl)-p-cresol, 2,6-bis-(2',3',4'-trihydroxy-5'-acetylbenzyl)-p-cresol, 2,6-bis(2',4',6'-trihydroxybenzyl)-p-cresol, 2,6 -bis(2',3',4'-trihydroxybenzyl)-p-cresol, 2,6-bis(2',3',4'-trihydroxybenzyl)- 3,5-dimethyl-phenol, 4,6-bis(4'-hydroxy- 3',5'-dimethylbenzyl)-pyrogallol, 4,6-bis-(4'-hydroxy-3',5'-dimethoxybenzyl)-pyrogallol, 2,6-bis-(4'-hydroxy-3',5'-dimethylbenzyl)- 1,3,4-trihydroxyphenol, 4,6-bis-(2',4',6'-trihydroxybenzyl)- 2,4-dimethylphenol, and 4,6-bis-(2',3',4'-trihydroxybenzyl)- 2,5-dimethylphenol.

Also, the low nuclide of a phenol resin, such as a novolac resin, etc., can be used.

The positive photoresist composition of the present invention can further contain a polyhydroxy compound for accelerating the dissolution thereof in a developer.

Examples of the polyhydroxy compound which can be preferably used for the foregoing purpose are phenols, resorcin, phloroglucin, 2,3,4-trihydroxybenzophenone, 2,3,4,4'-tetrahydroxybenzophenone, 2,3,4,3',4',5'-hexahydroxybenzophenone, an acetone-pyrogallol condensed resin, phloroglucide, 2,4,2',4'-biphenyltetrol, 4,4'-thiobis(1,3-dihydroxy)benzene, 2,2',4,4'-tetrahydroxy diphenyl ether, 2,2',4,4'-tetrahydroxydiphenyl sulfoxide, 2,2',4,4'-tetrahydroxydiphenyl sulfone, tris(4-hydroxyphenylmethane, 1,1-bis(4-hydroxyphenyl)cyclohexane, 4,4'-(α-methylbenzylidene)bisphenol, α,α',α"-tris(4-hydroxyphenyl)-1,3,5-triisopropylbenzene, α,α',α"-tris(4-hydroxyphenyl)-1-ethyl-4-isopropylbenzene, 1,2,2-tris(hydroxyphenyl)propane, 1,1,2-tris( 3,5-dimethyl-4-hydroxyphenyl)propane, 2,2,5,5 -tetrakis(4-hydroxyphenyl)hexane, 1,2-tetrakis(4-hydroxyphenyl)ethane, 1,1,3-tris(hydroxyphenyl)butane, and para[α,α,α',α'-tetrakis(4-hydroxyphenyl)]-xylene.

The polyhydroxy compound can be compounded in an amount of usually not more than 100 parts by weight, preferably not more than 70 parts by weight, and more preferably not more than 50 parts by weight per 100 parts by weight of the alkali-soluble resin.

As the solvent for dissolving the photosensitive material and the alkali-soluble resin in the present invention, there are ethylene glycol monomethyl ether, ethylene glycol monoethyl ether, methylcellosolve acetate, ethylcellosolve acetate, diethylene glycol monomethyl ether, diethylene glycol monoethyl ether, propylene glycol methyl ether acetate, propylene glycol propyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, etc.

The solvents can be used singly or as a combination of them.

Furthermore, the foregoing solvent can be used together with a high-boiling organic solvent such as N-methylformamide, N,N-dimethylformamide, N-methylacetamide, N,N-dimethylacetamide, N-methylpyrrolidone, dimethyl sulfoxide, benzyl ethyl ether, etc.

The positive photoresist composition of the present invention can further contain a surface active agent for improving the coating property such as a striation, etc.

As the surface active agent, there are, for example, nonionic surface active agents such as polyoxyethylene alkyl ethers (e.g., polyoxyethylene lauryl ether, polyoxyethylene stearyl ether, polyoxyethylene cetyl ether, and polyoxyethylene oleyl ether), polyoxyethylene alkylallyl ethers (e.g., polyoxyethylene octylphenol ether, and polyoxyethylene nonylphenol ether), polyoxyethylene-polyoxypropylene block copolymers, sorbitan fatty acid esters (e.g., sorbitan monolaurate, sorbitan monopalmitate, sorbitan monostearate, sorbitan monooleate, sorbitan trioleate, and sorbitan tristearate), polyoxyethylene sorbitan fatty acid esters (e.g., polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate), etc.; fluorine series surface active agents such as Eftop EF301, EF303, and EF352 (trade names, made by Sin Akita Kasei K.K.), Megafac F171 and F173 (trade names, made by Dainippon Ink and Chemicals, Inc.), Florad FC430 and FC431 (trade names, made by Sumitomo 3M Limited), Asahiguard AG710, Surflon S-382, SC101, SC102, SC103, SC104, SC105, and SC106 (trade names, made by Asahi Glass Co., Ltd.) etc.; and an organosiloxane polymer KP341 (trade name, made by Shin-Etsu Chemical Co., Ltd.); and acrylic acid series or methacrylic acid series copolymers, Polyflow No. 75 and No. 95 (trade names, made by Kyoei sha Yushi Kagaku Kogyo K.K.).

In these surface active agents, the fluorine series surface active agents and silicone series surface active agents are particularly preferred.

The compounding amount of the surface active agent is usually not more than 2 parts by weight, and preferably not more than 1 part by weight per 100 parts by weight of the alkali-soluble resin and the quinonediazide compound in the photoresist composition of the present invention.

These surface active agents can be added singly as a combination of them.

As the developer for the positive photoresist composition of the present invention, an aqueous solution of an alkali such as inorganic alkalis (e.g., sodium hydroxide, potassium hydroxide, sodium carbonate, sodium silicate, sodium metasilicate, and aqueous ammonia), primary amines (e.g., ethylamine and n-propylamine), secondary amines (e.g., diethylamine and di-n-butylamine), tertiary amines (e.g., triethylamine and methyldiethylamine), alcoholamines (e.g., dimethylethanolamine and triethanolamine), quaternary ammonium salts (e.g., tetramethylammonium hydroxide, tetraethylammonium hydroxide, and choline), and cyclic amines (e.g., pyrrole and piperidine).

Furthermore, the aqueous alkali solution described above can contain a proper amount of an alcohol such as isopropyl alcohol, etc., or a surface active agent such as a nonionic surface active agent.

In the alkalis for preparing the developer, the quaternary ammonium salts are preferred and tetramethylammonium hydroxide and choline are more preferred.

The positive photoresist composition of the present invention can, if necessary, contain a light absorber, a crosslinking agent, an adhesion aid, etc.

The light absorber is added, if necessary, to the photoresist composition for the purposes of inhibiting the halation from the substrate and increasing the visualization in the case of coating the photoresist composition on a transparent substrate. As the light absorber, the commercially available light absorbers described, e.g., in Kogyo yo Shikiso no Gijutu to Shijo (Techniques and Markets of Industrial Dyes), published by CMC and Senryo Binran (Dye Handbook), edited by Yuuki Gosei Kagaku Kyokai, such as, for example, C.I. Disperse Yellow 1, 3, 4, 5, 7, 8, 13, 23, 31, 49, 50, 51, 54, 56, 60, 64, 66, 68, 79, 82, 88, 90, 93, 102, 114, and 124; C.I. Disperse Orange 1, 5, 13, 25, 29, 30, 31, 44, 57, 72, and 73; C.I. Disperse Red 1, 5, 7, 13, 17, 19, 43, 50, 54, 58, 65, 72, 73, 88, 117, 137, 143, 199, and 210; C.I. Disperse Violet 43; C.I. Disperse Blue 96; C.I. Fluorescent Brightening Agent 112, 135, and 163; C.I. Solvent Yellow 14, 16, 33, and 56; C.I. Solvent Orange 2 and 45; C.I. Solvent Red 1, 3, 8, 23, 24, 25, 27, and 49; C.I. Pigment Green 10; and C.I. Pigment Brown 2 can be suitably used.

The light absorber is compounded in an amount of usually not more than 100 parts by weight, preferably not more than 50 parts by weight, and more preferably not more than 30 parts by weight per 100 parts by weight of the alkali-soluble resin.

The crosslinking agent is added in the range of giving no influences on the formation of positive images. The purposes of the addition of the crosslinking agent are mainly for the improvement of the sensitivity control and the heat resistance, the improvement of the dry etching resistance, etc.

As examples of the crosslinking agent, there are the compounds obtained by acting formaldehyde to melamine, benzoguanamine, glycoluril, etc., the alkyl-denatured products of the foregoing compounds, epoxy compounds, aldehydes, azido compounds, organic peroxides, hexamethylenetetramine, etc.

The crosslinking agent is added in an amount of less than 10 parts by weight, and preferably less than 5 parts by weight to 100 parts by weight of the photosensitive material in the photoresist composition. If the amount of the crosslinking agent is over 10 parts by weight, the sensitivity is lowered and scum (the resist residue) forms, which are undesirable.

The adhesion aid is added for the purpose of improving the adhesion of the resist and the substrate, and particularly for preventing the resist from releasing in the etching step.

Specific examples of the adhesion aid are chlorosilanes such as trimethylchlorosilane, dimethylvinylchlorosilane, methyldiphenylchlorosilane, chloromethyldimethylchlorosilane, etc.; alkoxysilanes such as trimethylmethoxysilane, dimethyldiethoxysilane, methyldimethoxysilane, dimethylvinylethoxysilane, diphenyldimethoxysilane, phenyltriethoxysilane, etc.; silazanes such as hexamethylsilazane, N,N'-bis(trimethylsilyl)urea, dimethyltrimethylsilylamine, trimethylsilylimidazole, etc.; silanes such as vinyltrichlorosilane, γ-chloropropyltrimethoxysilane, γ-aminopropyltriethoxysilane, γ-glycidoxypropyltrimethoxysilane, etc.; heterocyclic compounds such as benzotriazole, benzimidazole, indazole, imidazole, 2-mercaptobenzimidazole, 2-mercaptobenzothiazole, 2-mercaptobenzoxazole, urazole, thiourasil, mercaptoimidazole, mercaptopyrimidine, etc.; ureas such as 1,1-dimethylurea, 1,3-dimethylurea, etc., and thiourea compounds.

The adhesion aid is compounded in the amount of usually less than 10 parts by weight, and preferably less than 5 parts by weight per 100 parts by weight of the alkali-soluble resin.

A good resist can be obtained by coating the positive photoresist composition of the present invention described above on a substrate being used for the production of a precise integrated circuit element (e.g., a transparent substrate such as a silicon substrate coated with silicon oxide, a glass substrate, an ITO substrate, etc.) by a proper coating method such as a spinner, a coater, etc., followed by baking, light-exposing through a definite mask, if necessary, heating (PEB: pose exposure baking), developing, rinsing, and drying.

Then, the examples of the present invention but the invention is not limited to them. In addition, in these examples, % is by weight unless otherwise indicated.

SYNTHESIS EXAMPLE (1)

Synthesis of Compound [I-1]

In a four neck flask equipped with a stirrer, a reflux condenser, a thermometer, and a dropping means were placed 176.3 g of 4-cyclohexylphenol, 455.8 g of an aqueous solution of 25% tetramethylammonium hydroxide, and 500 ml of distilled water and the mixture was stirred under heating to 50° C. to dissolve 4-cyclohexylphenol. To the mixed solution was added dropwise 483.4 g of an aqueous solution of 37% formalin and the mixture was stirred for 8 hours under heating. To the reaction mixture obtained was added dropwise 75 g of acetic acid to precipitate a white powder, which was collected by filtration to provide 160 g of Compound (a).

In the flask described above were placed 118 g of the compound (a) thus obtained, 706 g of phenol, and 1 liter of methanol to dissolve the compound (a), and thereafter, 5 g of sulfuric acid was added dropwise to the solution over a period of 10 minutes. The mixture was refluxed under heating and stirred for 5 hours. The reaction mixture obtained was poured to 10 liter of distilled water and a white solid thus precipitated was collected by filtration. To the white solid was added 2 liters of toluene and the mixture thus obtained was stirred for 30 minutes. After filtrating off insoluble matters, 80 g of the filtrate (Compound [I-1]), which was the desired material, was obtained. The purity of the desired product thus obtained was 99% as the result of analyzing GPC as a polystyrene standard.

SYNTHESIS EXAMPLE (2)

Synthesis of Compound [I-2]

By following the Synthesis Example (1) except that 540 g of o-cresol was used in place of the phenol in the Synthesis Example (1), Compound [I-2] was synthesized. The purity of the product obtained was 99%.

SYNTHESIS EXAMPLE (3)

Synthesis of Compound [I-5]

In a four neck flask equipped with a stirrer, a reflux condenser, a thermometer and a dropping means were placed 108.1 g of p-cresol and 455.6 g of an aqueous solution of 25% tetramethylammonium hydroxide and mixture was stirred under heating to 45° C. When the mixture became a homogeneous state, 150 g of para-formaldehyde was added thereto over a period of 15 minutes to dissolve it. The mixture was heated to 50° C. and stirred for 6 hours. The reaction mixture obtained was allowed to cool and when the temperature thereof became 25° C., 72 g of ammonium carbonate was added to the mixture over a period of 30 minutes to form a white solid, which was collected by filtration. To the white solid obtained was added 300 ml of distilled water followed by stirring for 30 minutes and the solid was collected by filtration to provide 130 g of a white powder [Compound (b)].

In the same flask were placed 168 g of the compound (b) thus obtained, 1.14 kg of 2-cyclohexyl-5-methylphenol, and 2 liters of methanol and when the mixture became a homogeneous state, 10 g of sulfuric acid was added thereto followed by refluxing under heating and stirring for 6 hours. The reaction mixture obtained was poured in 20 liters of distilled water to form a white solid, which was collected by filtration. To the white solid was added 4 liters of toluene and after stirring the mixture for 30 minutes, insoluble matters were filtered off to provide 120 g of a filtrate (Compound [I-5]) as a white powder. The purity of the desired product obtained 98% by the analysis with GPC as a polystyrene standard.

SYNTHESIS EXAMPLE (4)

Synthesis of Compound [II-1]

By following the same procedure as Synthesis Example (1) except that 2-cyclohexylphenol was used in place of 4-cyclohexylphenol, Compound [II-1] was synthesized. The purity of the desired product was 99%.

SYNTHESIS EXAMPLE (5)

Synthesis of Compound [II-2]

By following the same procedure as Synthesis Example (1) except that 2-cyclohexyl-5-methylphenol was used in place of 4-cyclohexylphenol, Compound [II-2] was synthesized. The purity of the desired product was 98%.

SYNTHESIS EXAMPLE (6)

Synthesis of Compound [II-3]

By following the same procedure as Synthesis Example (1) except that 2-cyclohexyl-5-methylphenol and o-cresol were used in place of 4-cyclohexylphenol and phenol, respectively in Synthesis Example (1), Compound [II-3] was synthesized. The purity of the desired object was 98%.

SYNTHESIS EXAMPLE (7)

Synthesis of Photosensitive Material (a)

In a three neck flask were placed 38.9 g of Compound [I-1], 53.7 g of 1,2-naphthoquinonediazido-5-sulfonyl chloride, and 800 ml of acetone and they were uniformly dissolved. Then, 20.8 g of N-methylpiperidine was gradually added dropwise to the solution and the reaction was carried out for 3 hours at 25° C. The reaction mixture obtained was poured in 3 liter of an aqueous solution of 1% hydrochloric acid and precipitates thus formed were collected by filtration, washed with water, and dried at 40° C. to provide 76.8 g of the 1,2-naphthoquinonediazido-5-sulfonic acid ester of the compound [I-1] [photosensitive material (a)].

In the high-speed liquid chromatography measured using a detector using a ultraviolet ray of 254 nm, the diester compound of the photosensitive material (a) was 82% of the whole pattern areas and also the complete ester compound (triester compound) was 10% of the whole pattern areas.

In addition, the measurement of the foregoing high-speed liquid chromatography was carried out by using a LC-6A Chromatograph, made by Shimazu Corporation, using Nova-PakC$_{18}$ (4 μm) 8 mmφ×100 mm column, made by Waters Co., and at a flow rate of 2.0 ml/minute of a solution composed of 68.6% water, 30.0% acetonitrile, 0.7% triethylamine, and 0.7% phosphoric acid as a carrier solvent.

SYNTHESIS EXAMPLE (8)

Synthesis of Photosensitive Material (b)

In a three neck flask were placed 41.7 g of the compound [I-2], 53.7 g of 1,2-naphthoquinonediazido-5-sulfonyl chloride, and 800 ml of acetone and they were uniformly dissolved. Then, 20.8 g of N-methylpiperidine was gradually added dropwise to the solution and the reaction was carried out for 3 hours at 25° C. The reaction mixture was poured in 3 liters of an aqueous solution of 1% hydrochloric acid and the precipitates thus formed were collected by filtration, washed with water, and dried at 40° C. to provide 79.4 g of the 1,2-naphthoquinonediazido-5-sulfonic acid ester of the compound [I-2] [photosensitive material (b)].

In the high-speed liquid chromatography measured by using detector using a ultraviolet rays of 254 nm, the diester compound of the photosensitive material (b) was 78% of the whole pattern areas and also the complete ester compound (triester compound) was 12% of the whole pattern areas.

SYNTHESIS EXAMPLE (9)

Synthesis of Photosensitive Material (c)

In a three neck flask were placed 51.7 g of the compound [I-5], 53.7 g of 1,2-naphthoquinonediazido-5-sulfonyl chloride, and 900 ml of chloroform, then, 20.8 g of N-methylpiperidine was gradually added dropwise to the mixture, and the reaction was carried out for 3 hours at 25° C. The reaction mixture was concentrated, re-dissolved in 900 ml of 1,4-dioxane, the mixed liquid was poured in 3 liters of an aqueous solution of 1% hydrochloric acid, and the precipitates thus formed were collected by filtration, washed with water, and dried at 40° C. to provide 88.4 g of the 1,2-naphthoquinonediazido-5-sulfonic acid ester of the compound [I-5] [the photosensitive material (c)].

In the high-speed liquid chromatography measured by using a detector using a ultraviolet ray of 254 nm, the diester compound of the photosensitive material (c) was 89% of the whole pattern areas and the complete ester compound (triester compound) was 8% of the whole pattern areas.

SYNTHESIS EXAMPLE (10)

Synthesis of Photosensitive Material (d)

In a three neck flask were placed 38.9 g of the compound [II-1], 53.7 g of 1,2-naphthoquinonediazido-5-sulfonyl chloride, and 800 ml of acetone and they were uniformly dissolved. Then, 20.8 g of N-methylpiperidine was gradually added dropwise to the solution and the reaction was carried out for 3 hours at 25° C. The reaction mixture obtained was poured in 3 liters of an aqueous solution of 1% hydrochloric acid and the precipitates thus formed were collected by filtration, washed with water, and dried at 40° C. to provide 76.8 g of the 1,2-naphthoquinonediazido-5-sulfonic acid ester of the compound [II-1] [the photosensitive material (d)].

In the high-speed liquid chromatography measured by using a detector using a ultraviolet ray of 254 nm, the diester compound of the photosensitive material (d) was 87% of the whole pattern areas and the complete ester compound (triester compound) was 6% of the whole pattern areas.

SYNTHESIS EXAMPLE (11)

Synthesis of Photosensitive Material (e)

In a three neck flask were placed 40.3 g of the compound [II-2], 53.7 g of 1,2-naphthoquinonediazido-5-sulfonyl chloride, and 800 ml of chloroform, then, 20.8 g of N-methylpiperidine was gradually added dropwise to the mixture, and the reaction was carried out for 3 hours at 25° C. The reaction mixture obtained was concentrated, re-dissolved in 800 ml of 1,4-dioxane, the mixed liquid was poured in 3 liters of an aqueous solution of 1% hydrochloric acid, and the precipitates thus formed were collected by filtration, washed with water, and dried at 40° C. to provide the 78.1 g of the 1,2-naphthoquinonediazido-5-sulfonic acid ester of the compound [II-2] [the photosensitive material (e)].

In the high-speed liquid chromatography measured by using a detector using a ultraviolet ray of 254 nm, the diester compound of the photosensitive material (e) was 90% of the whole pattern areas and the complete ester compound (triester compound) was 5% of the whole pattern areas.

SYNTHESIS EXAMPLE (12)

Synthesis of Photosensitive Material (f)

In a three neck flask were placed 43.1 g of the compound [II-3], 53.7 g of 1,2-naphthoquinonediazido-5-sulfonyl chloride, and 900 ml of chloroform, then 20.8 g of N-methylpiperidine was gradually added dropwise to the mixture, and the reaction was carried out for 3 hours at 25° C. The reaction mixture was concentrated, re-dissolved in 900 ml of 1,4-dioxane, the mixed liquid was poured in 3 liters of an aqueous solution of 1% hydrochloric acid, and the precipitates thus formed were collected by filtration, washed with water, and dried at 40° C. to provide 80.6 g of the 1,2-naphthoquinonediazido-5-sulfonic acid ester of the compound [II-3] [the photosensitive material (f)].

In the high-speed liquid chromatography measured by using a detector using a ultraviolet ray of 254 nm, the diester compound of the photosensitive material (f) was 88% of the whole pattern areas and also the complete ester compound (triester compound) wad 7% of the whole pattern areas.

SYNTHESIS EXAMPLE (13)

Synthesis of Photosensitive Material (g)

In a three neck flask were placed 38.9 g of the compound [I-1], 64.5 g of 1,2-naphthoquinonediazido-5-sulfonyl chloride, and 800 ml of acetone and they were uniformly dissolved. Then, 25.5 g of triethylamine was gradually added dropwise to the solution and the reaction was carried out for 3 hours at 25° C. The reaction mixture was poured in 3 liters of an aqueous solution of 1% hydrochloric acid and the precipitates formed were collected by filtration, washed with water, and dried at 40° C. to provide 80.7 g of the 1,2-naphthoquinonediazido-5-sulfonic acid ester of the compound [I-1] [the photosensitive material (g)].

In the high-speed liquid chromatography measured by using a detector using a ultraviolet ray of 254 nm, the diester compound of the photosensitive material (g) was 63% of the whole pattern areas and the complete ester compound (triester compound) was 27% of the whole pattern areas.

SYNTHESIS EXAMPLE (14)

Synthesis of Photosensitive Material (h)

In a three neck flask were placed 51.7 g of the compound [I-5], 40.3 g of 1,2-naphthoquinonediazido-5-sulfonyl chloride, and 700 ml of acetone and they were uniformly dissolved. Then, 15.9 g of triethylamine was gradually added dropwise to the solution and the reaction was carried out for 4 hours at 25° C. The reaction mixture was poured in 2.5 liters of an aqueous solution of 1% hydrochloric acid and the precipitates thus formed were collected by filtration, washed with water, and dried at 40° C. to provide 69.9 g of the 1,2-naphthoquinonediazido-5-sulfonic acid ester of the compound [I-5] [the photosensitive material (h)].

In the high-speed liquid chromatography measured by using a detector using a ultraviolet ray of 254 nm, the diester compound of the photosensitive material (h) was 51% of the whole pattern areas and the complete ester compound (triester compound) was 18% of the whole pattern area.

SYNTHESIS EXAMPLE (15)

Synthesis of Photosensitive Material (i)

In a three neck flask were placed 38.9 g of the compound [II-1], 27.0 g of 1,2-naphthoquinonediazido-5-sulfonyl chloride, and 500 ml of acetone and they were uniformly dissolved. Then, 10.6 g of triethylamine was gradually added dropwise to the solution and the reaction was carried out for 4 hours at 15° C. The reaction mixture was poured in 2 liters of an aqueous solution of 1% hydrochloric acid and the precipitates thus formed were collected by filtration, washed with water, and dried at 40° C. to provide 49.4 g of the 1,2-naphthoquinonediazido-5-sulfonic acid ester of the compound [II-1] [the photosensitive material (i)].

In a high-speed liquid chromatography measured by using a detector using a ultraviolet ray of 254 nm, the diester compound of the photosensitive material (i) was 41% of the whole pattern areas and the complete compound (triester compound) was 11% of the whole pattern areas.

SYNTHETIC EXAMPLE (16)

Synthesis of Photosensitive Material (j)

In a three neck flask were placed 19.5 g of the compound [II-1], 40.3 g of 1,2-naphthoquinonediazido-5-sulfonyl chloride, and 500 ml of acetone and they were uniformly dissolved. Then, 15.9 g of triethylamine was gradually added dropwise to the solution and the reaction was carried out for 6 hours at 15° C. The reaction mixture was poured in 2 liters of an aqueous solution of 1% hydrochloric acid and the precipitates thus formed were collected by filtration, washed with water, and dried at 40° C. to provide 49.0 g of the 1,2-naphthoquinonediazido-5-sulfonic acid ester of the compound [II-1] [the photosensitive material (j)].

In the high-speed liquid chromatography measured by using a detector using a ultraviolet ray of 254 nm, the diester compound of the photosensitive material (j) was 6% of the whole pattern areas and the complete ester compound (triester compound) was 91% of the whole pattern areas.

SYNTHESIS EXAMPLE (17)

Synthesis of Photosensitive Material (k)

In a three neck flask were placed 24.4 g of the compound shown below, 53.7 g of 1,2-naphthoquinonediazido-5-sulfonyl chloride, and 600 ml of chloroform and they were uniformly dissolved. Then, 21.2 g of triethylamine was gradually added dropwise to the solution and the reaction was carried out for 3 hours at 25° C. The reaction mixture was concentrated and re-dissolved in acetone. The solution obtained was poured in 1.5 liters of an aqueous solution of 1% hydrochloric acid and the precipitates thus formed were collected by filtration, washed with water, and dried at 40° C. to provide 63.8 g of the 1,2-naphthoquinonediazido-5-sulfonic acid ester of the following compound [the photosensitive material (k)].

In the high-speed liquid chromatography measured by using a detector using a ultraviolet ray of 254 nm, the diester compound of the photosensitive material (k) was 80% of the whole pattern areas and the complete ester compound (triester compound) was 8% of the whole pattern areas.

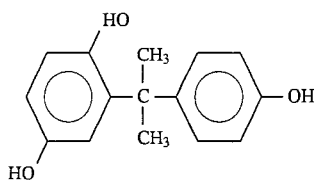

SYNTHESIS EXAMPLE (18)

Synthesis of Photographic Material (l)

In a three neck flask were placed 35.2 g of the compound shown below, 107.5 g of 1,2-naphthoquinonediazido-5-sulfonyl chloride, and 1.2 liters of acetone and they were uniformly dissolved. Then, 42.5 g of triethylamine was gradually added dropwise to the solution and the reaction was carried out for 3 hours at 25° C. The reaction mixture obtained was poured in 4 liters of an aqueous solution of 1% hydrochloric acid and the precipitates thus formed were collected by filtration, washed with water, and dried at 40° C. to provide 115.2 of the 1,2-naphthoquinonediazido-5-sulfonic acid ester of the following compound [the photosensitive material (l)].

In the high-speed liquid chromatography measured by using a detector using a ultraviolet ray of 254 nm, the diester compound of the photosensitive material (l) was 15% of the whole pattern areas and the complete ester compound (pentaester compound) was 5% of the whole pattern areas.

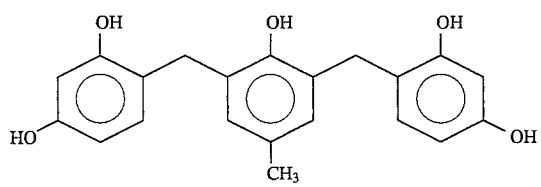

SYNTHESIS EXAMPLE (19)

Synthesis of Photosensitive Material (m)

In a three neck flask were placed 37.6 g of the compound shown below, 53.7 g of 1,2-naphthoquinonediazido-5-sulfonyl chloride, and 750 ml of chloroform and they were uniformly dissolved. Then, 21.2 g of triethylamine was gradually added dropwise to the solution and the reaction was carried out for 3 hours at 25° C. The reaction mixture obtained was concentrated and re-dissolved in acetone. The mixed liquid was poured in 2.5 liters of an aqueous solution of 1% hydrochloric acid and the precipitates thus formed were collected by filtration, washed with water and dried at 40° C. to provide 74.6 g of the 1,2-naphthoquinonediazido-5-sulfonic acid ester of the following compound [the photosensitive material (m)].

In the high-speed liquid chromatography measured by using a detector using a ultraviolet ray of 254 nm. the diester compound of the photosensitive material (m) was 62% of the whole pattern areas and the complete ester compound (triester compound) was 13% of the whole pattern areas.

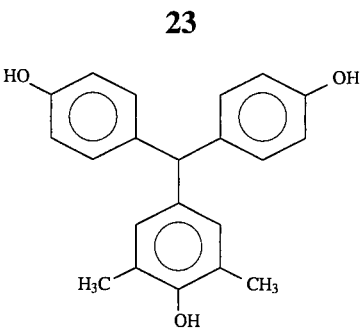

SYNTHESIS EXAMPLE (20)

Synthesis of Photosensitive Material (n)

In a three neck flask were placed 37.6 g of the compound shown below, 53.7 g of 1,2-naphthoquinonediazido-5-sulfonyl chloride, and 750 ml of acetone and they were uniformly dissolved. Then, 21.2 g of triethylamine was gradually added dropwise to the solution and the reaction was carried out for 3 hours at 25° C. The reaction mixture obtained was poured in 2500 ml of an aqueous solution of 1% hydrochloric acid and the precipitates thus formed were collected by filtration, washed with water, and dried at 40° C. to provide 72.1 g of the 1,2-naphthoquinonediazido-5-sulfonic acid ester of the following compound [the photosensitive material (n)].

In the high-speed liquid chromatography measured by using a detector using a ultraviolet ray of 254 nm, the diester compound of the photosensitive material (n) was 38% of the whole pattern areas and the complete ester compound (triester compound) was 52% of the whole pattern areas.

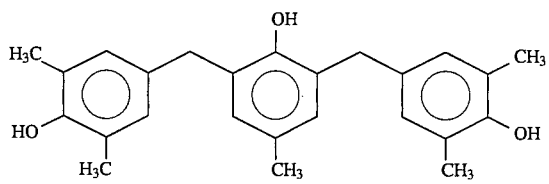

SYNTHESIS EXAMPLE (21)

Synthesis of Photosensitive Material (o)

In a three neck flask were placed 37.6 g of the compound shown below, 53.7 g of 1,2-naphthoquinonediazido-5-sulfonyl chloride, and 750 ml of chloroform and they were uniformly dissolved. Then, 21.2 g of triethylamine was gradually added dropwise to the solution and the reaction was carried out for 3 hours at 25° C. The reaction mixture thus obtained was concentrated and re-dissolved in 500 ml of acetone. Then, the solution was poured in 2.5 liters of an aqueous solution of 1% hydrochloric acid and the precipitates thus formed were collected by filtration, washed with water, and dried at 40° C. to provide 75.7 g of the 1,2-naphthoquinonediazido- 5-sulfonic acid ester of the following compound [the photosensitive material (o)].

In the high-speed liquid chromatography measured by using a detector using a ultraviolet ray of 254 nm, the diester compound of the photosensitive material (o) wad 72% of the whole pattern areas and the complete ester compound (triester compound) was 19% of the whole pattern areas.

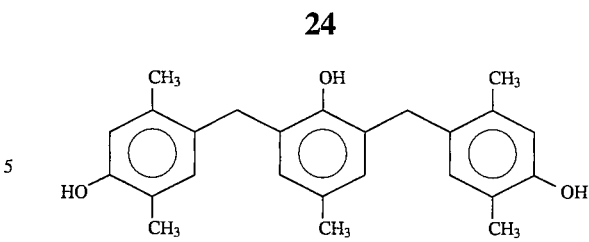

SYNTHESIS EXAMPLE (22)

Synthesis of Photosensitive Material (p)

According to the synthesis method described in JP-A-5-323597, the 1,2-naphthoquinonediazido-5-sulfonic acid ester of the compound shown below [the photosensitive material (p)] was obtained.

In the high-speed liquid chromatography measured by using a detector using a ultraviolet ray of 254 nm, the diester compound of the photosensitive material (p) was 83% of the whole pattern areas, and the complete ester compound (triester compound) was 11% of the whole pattern areas.

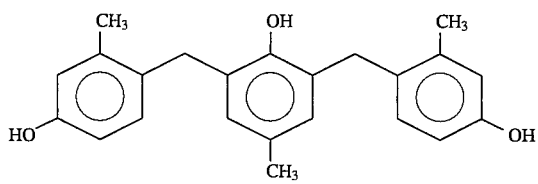

SYNTHESIS EXAMPLE (23)

Synthesis of Photosensitive Material (q)

According to the synthesis method described in U.S. Pat. No. 5,178,986, the 1,2-naphthoquinonediazido-5-sulfonic acid ester of the compound shown below [the photosensitive material (q)] was obtained.

In the high-speed liquid chromatography measured by using a detector using a ultraviolet ray of 254 nm, the diester compound of the photosensitive material (q) was 35% of the whole pattern areas and the complete ester compound (triester compound) was 51% of the whole pattern areas.

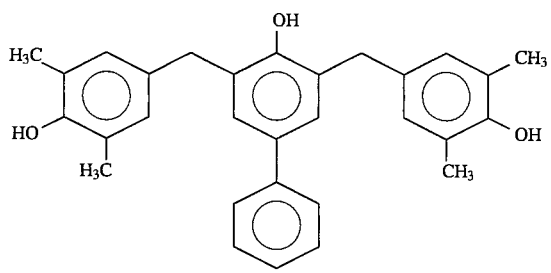

SYNTHESIS EXAMPLE (24)

Synthesis of Novolac Resin A

In a three neck flask were placed 45 g of m-cresol, 55 g of p-cresol, 49 g of an aqueous solution of 37% formalin, and 0.13 g of oxalic acid and after raising the temperature of the mixture to 100° C. with stirring, the reaction was carried out for 15 hours.

Thereafter, the temperature was raised to 200° C. and the pressure was gradually lowered to 5 mm Hg to remove water, the unreacted monomers, formaldehyde, oxalic acid, etc.

Then, the molten alkali-soluble novolac resin thus formed was allowed to cool to room temperature and recovered.

The weight-average molecular weight of the novolac resin A obtained was 8100 (converted as polystyrene) and the degree of dispersion thereof was 6.30.

SYNTHESIS EXAMPLE (25)

Synthesis of Novolac Resin B

In a three neck flask were placed 50 g of m-cresol, 25 g of p-cresol, 28 g of 2,5-xylenol, 53 g of an aqueous solution of 37% formalin, and 0.15 g of oxalic acid, the temperature of the mixture was raised to 100° C. with stirring, and the reaction was carried out for 14 hours.

Thereafter, the temperature was raised to 200° C. and the pressure was gradually lowered to 1 mm Hg to remove water, the unreacted monomers, formaldehyde, oxalic acid, etc.

Then, the molten novolac resin thus formed was allowed to cool to room temperature and recovered.

The weight-average molecular weight of the novolac resin obtained was 4800 (converted as polystyrene).

Then, after completely dissolving 20 g of the novolac resin in 60 g of methanol, 30 g of water was gradually added to the solution with stirring to precipitate the resin component. The upper layer formed was removed by decantation and the precipitated resin component was recovered, heated to 40° C., and dried for 24 hours under reduced pressure to provide an alkali-soluble novolac resin B.

The weight-average molecular weight of the novolac resin was 9960 (converted as polystyrene) and the degree of dispersion thereof was 3.50. Also, the contents of monomers, dimers, and trimers were 0%, 2.3%, and 3.5%, respectively, which showed that 43% of the low molecular components had been removed by the fractional reprecipitation operation.

SYNTHESIS EXAMPLE (26)

Synthesis of Novolac Resin C

In a three neck flask were placed 60 g of m-cresol, 20 g of p-cresol, 25 g of 2,3,5-trimethylphenol, 56 g of an aqueous solution of 37% formalin, and 0.16 g of oxalic acid, the temperature of the mixture was raised to 100° C. with stirring, and the reaction was carried out for 16 hours.

Thereafter, the temperature was raised to 200° C. and the pressure of the system was gradually lowered to 1 mm Hg to remove water, the unreacted monomers, formaldehyde, oxalic acid, etc. Then, the molten novolac resin obtained was allowed to cool to room temperature and recovered.

The weight-average molecular weight of the novolac resin obtained was 3800 (converted as polystyrene).

Then, after completely dissolving 20 g of the novolac resin in 60 g of acetone, 60 g of hexane was gradually added to the solution with stirring, the mixture was allowed to stand for 2 hours, the upper layer thus formed was removed by decantation, and the resin component thus precipitated was recovered, heated at 40° C., and dried for 24 hours under reduced pressure to provide an alkali-soluble novolac resin C.

The weight-average molecular weight of the novolac resin C obtained was 8300 (converted as polystyrene) and the degree of dispersion thereof was 3.20. Also, the contents of monomers, dimers, and trimers were 0%, 2.1%, and 3.0%, respectively, which showed that 56% of the low molecular components were removed by the fractional reprecipitation operation.

SYNTHESIS EXAMPLE (27)

Synthesis of Novolac Resin D

After mixing 30 g of p-cresol, 14 g of o-cresol, 50 g of 2,3-dimethylphenol, 20 g of 2,3,5-trimethylphenol, and 4.9 g of 2,6-dimethylphenol with 50 g of diethylene glycol monomethyl ether, the mixture was placed in a three neck flask equipped with a stirrer, a reflux condenser, and a thermometer. Then, 85 g of an aqueous solution of 37% formalin was added to the mixture and resultant mixture was stirred under heating in an oil bath of 110° C. When the inside temperature reached 90° C., 6.3 g of oxalic acid dihydrate was added to the mixture. Thereafter, the reaction was continued for 18 hours while keeping the temperature of the oil bath at 130° C. and then, after removing the reflux condenser, the reaction mixture was distilled under reduced pressure at 200° C. to remove the unreacted monomers.

The weight-average molecular weight of the novolac resin thus obtained was 3280 and the degree of dispersion thereof was 2.75.

EXAMPLES 1 TO 16 AND COMPARATIVE EXAMPLES 1 TO 9

Preparation and Evaluation of Positive Photoresist Compositions

After mixing each of the photosensitive materials (a) to (q) obtained by the Synthesis Examples (7) to (23) described above, each of the novolac resins A to D obtained by the synthesis Examples (24) to (27), each solvent, and, if necessary, each polyhydroxy compound at the ratio shown in Table 1 below and forming each uniform solution, the solution was filtered using a Teflon-made micro filter having pore sizes of 0.10 μm to provide each photoresist composition.

TABLE 1

| Formulation of Positive Photoresist Composition | | | | | | | |
|---|---|---|---|---|---|---|---|
| Novolac Resin | | Photo-sensitive Material | | Poly-hydroxy Compound | | Solvent | |
| (a) | (b) | (a) | (b) | (a) | (b) | (a) | (b) |
| Ex. 1 | A | 100 | a | 26 | — | — | S-1 | 350 |
| Ex. 2 | A | 100 | b | 26 | — | — | S-1 | 380 |
| Ex. 3 | A | 100 | c | 27 | — | — | S-3 | 360 |
| Ex. 4 | B | 82 | a | 28 | P-1 | 18 | S-2/S-4 | 285/95 |
| Ex. 5 | B | 78 | b/l | 16/16 | P-2 | 22 | S-1 | 380 |
| Ex. 6 | B | 80 | d | 30 | P-3 | 20 | S-2 | 380 |
| Ex. 7 | B | 83 | e | 27 | P-2 | 17 | s-3 | 360 |
| Ex. 8 | B | 77 | g | 33 | P-3 | 23 | s-2 | 380 |
| Ex. 9 | B | 79 | h | 31 | P-1 | 21 | S-2 | 370 |
| Ex. 10 | C | 82 | a | 27 | P-3 | 18 | S-2/S-4 | 285/95 |
| Ex. 11 | C | 79 | b | 31 | P-1 | 21 | S-1 | 340 |
| Ex. 12 | C | 83 | f | 30 | P-3 | 17 | S-1 | 350 |
| Ex. 13 | C | 78 | g | 32 | P-2 | 22 | S-2 | 380 |
| Ex. 14 | D | 82 | a | 30 | P-2 | 18 | S-1 | 340 |
| Ex. 15 | D | 86 | b | 28 | P-3 | 14 | S-1 | 340 |
| Ex. 16 | D | 86 | g | 29 | P-1 | 14 | S-2 | 370 |

TABLE 1-continued

| | Formulation of Positive Photoresist Composition | | | | | | | |
|---|---|---|---|---|---|---|---|---|
| | Novolac Resin | | Photo-sensitive Material | | Poly-hydroxy Compound | | Solvent | |
| | (a) | (b) | (a) | (b) | (a) | (b) | (a) | (b) |
| Comp. 1 | A | 100 | k | 29 | — | — | S-1 | 350 |
| Comp. 2 | A | 100 | l | 27 | — | — | S-1 | 350 |
| Comp. 3 | A | 100 | m | 27 | — | — | S-2 | 380 |
| Comp. 4 | A | 100 | n | 28 | — | — | S-2 | 380 |
| Comp. 5 | A | 100 | p | 29 | — | — | S-2 | 380 |
| Comp. 6 | A | 100 | q | 27 | — | — | S-2 | 380 |
| Comp. 7 | B | 79 | i | 33 | P-1 | 21 | S-2 | 370 |
| Comp. 8 | B | 79 | j | 33 | P-3 | 21 | S-2 | 380 |
| Comp. 9 | C | 78 | o | 32 | P-2 | 22 | S-1 | 350 |

(a): Kind;
(b): Addition amount
Ex. 1 to Ex. 16: Examples of the present invention
Comp. 1 to Comp. 9: Comparative examples
P-1: α,α,α'-Tris(4-hydroxyphenyl)-1-ethyl-4-isopropylbenzene
P-2: Tris(4-hydroxyphenyl)methane
P-3: 1,1-Bis(4-hydroxyphenyl)cyclohexane
S-1: Ethylcellosolve acetate
S-2: Ethyl 2-hydroxypropionate
S-3: Methyl 3-methoxypropionate
S-4: Ethyl 3-ethoxypropionate Each photoresist composition was coated on a silicon wafer using a spinner at a changed rotation number and dried for 60 seconds at 90° C. by a vacuum adsorption type hot plate to form each of the resist layers having a thicknesses of 0.97 μm and 1.02 μm, respectively.

After exposing each layer using a reducing projection exposure apparatus, NSR-2005i9C, manufactured by Nikon Corporation, PEB was carried out for 60 seconds at 110° C., the exposed layer was developed with an aqueous solution of 2.38% tetramethylammonium hydroxide for one minute, washed with water for 30 seconds, and dried.

Each of the resist patterns on the silicon wafers thus formed was observed by a scanning type electron microscope and the resist was evaluated. The results obtained are shown in Table 2 below.

In the evaluations:

The sensitivity was defined as the reciprocal of the exposure amount of reproducing a mask pattern of 0.60 μm and shown by the relative value to the sensitivity of the resist layer of 1.02 μm in thickness in Comparative Example 1.

The resolving power was shown by the limiting resolving power in the exposure amount of reproducing the mask patten of 0.60 μm.

The heat resistance was shown by the temperature at which the silicon wafer having formed thereon the resist pattern was baked on a hot plate for 4 minutes and the pattern was not changed.

The form of the resist was shown by the angle (θ) formed by the wall surface of the resist and the surface of the silicon wafer at the cross section of the resist pattern of 0.50 μm.

The development residue was determined by observing the silicon wafer having formed thereon the resist pattern by a scanning type electron microscope. The sample wherein the residue was not observed was shown by A and the sample wherein the residue was observed was shown by C.

As to the storage stability, the solution of each positive photoresist composition was allowed to stand at room temperature and after 3 months, the presence of precipitates in the solution was determined. The sample wherein any precipitates were not observed was shown by A and the sample wherein precipitates were observed was shown by C.

TABLE 2

| | Evaluation Result of Resist Performance | | | | | | | | |
|---|---|---|---|---|---|---|---|---|---|
| | Relative Sensitivity | | Resolving Power Layer Thickness | | Heat Resistance Layer Thickness | Resist Form Layer Thickness | | | |
| | Layer Thickness | | 0.97 | 1.02 | 0.97 | 0.97 | 1.02 | Development | Storage |
| No. | 0.97 | 1.02 | (μm) | (μm) | (°C.) | (θ) | (θ) | Residue | Stability |
| Ex. 1 | 1.1 | 1.2 | 0.32 | 0.32 | 150 | 89 | 89 | A | A |
| Ex. 2 | 1.2 | 1.3 | 0.32 | 0.32 | 150 | 88 | 89 | A | A |
| Ex. 3 | 1.1 | 1.2 | 0.32 | 0.32 | 150 | 89 | 89 | A | A |
| Ex. 4 | 1.2 | 1.4 | 0.30 | 0.30 | 160 | 89 | 89 | A | A |
| Ex. 5 | 1.2 | 1.3 | 0.32 | 0.32 | 160 | 88 | 88 | A | A |
| Ex. 6 | 1.1 | 1.2 | 0.30 | 0.30 | 160 | 89 | 89 | A | A |
| Ex. 7 | 1.2 | 1.3 | 0.28 | 0.28 | 160 | 88 | 88 | A | A |
| Ex. 8 | 1.1 | 1.2 | 0.30 | 0.30 | 160 | 89 | 89 | A | A |
| Ex. 9 | 1.2 | 1.3 | 0.32 | 0.32 | 160 | 88 | 88 | A | A |
| Ex. 10 | 1.1 | 1.3 | 0.30 | 0.30 | 160 | 88 | 88 | A | A |
| Ex. 11 | 1.1 | 1.2 | 0.30 | 0.30 | 160 | 88 | 88 | A | A |
| Ex. 12 | 1.1 | 1.2 | 0.30 | 0.30 | 160 | 89 | 89 | A | A |
| Ex. 13 | 1.1 | 1.1 | 0.32 | 0.32 | 160 | 88 | 88 | A | A |
| Ex. 14 | 1.1 | 1.2 | 0.28 | 0.28 | 160 | 89 | 89 | A | A |
| Ex. 15 | 1.2 | 1.3 | 0.28 | 0.28 | 160 | 89 | 89 | A | A |
| Ex. 16 | 1.1 | 1.2 | 0.30 | 0.30 | 160 | 89 | 89 | A | A |
| Comp. 1 | 0.9 | 1.0 | 0.40 | 0.42 | 140 | 84 | 83 | A | A |
| Comp. 2 | 1.3 | 1.4 | 0.32 | 0.36 | 150 | 85 | 84 | A | A |
| Comp. 3 | 1.2 | 1.3 | 0.36 | 0.32 | 150 | 87 | 84 | A | A |
| Comp. 4 | 0.9 | 1.1 | 0.32 | 0.36 | 150 | 86 | 86 | C | C |
| Comp. 5 | 1.1 | 1.2 | 0.30 | 0.30 | 150 | 88 | 87 | A | C |
| Comp. 6 | 0.9 | 1.0 | 0.34 | 0.32 | 150 | 85 | 84 | A | C |

TABLE 2-continued

| | Evaluation Result of Resist Performance | | | | | | | |
|---|---|---|---|---|---|---|---|---|
| | Relative Sensitivity | | Resolving Power Layer Thickness | | Heat Resistance Layer Thickness | Resist Form Layer Thickness | | | |
| | Layer Thickness | | 0.97 | 1.02 | 0.97 | 0.97 | 1.02 | Development | Storage |
| No. | 0.97 | 1.02 | (μm) | (μm) | (°C.) | (θ) | (θ) | Residue | Stability |
| Comp. 7 | 1.4 | 1.5 | 0.32 | 0.32 | 150 | 83 | 81 | A | A |
| Comp. 8 | 0.7 | 0.8 | 0.32 | 0.32 | 160 | 89 | 89 | A | C |
| Comp. 9 | 1.1 | 1.2 | 0.30 | 0.30 | 160 | 88 | 88 | A | C |

As described above, it can be seen that the positive photoresists using the photosensitive materials of the present invention are excellent in the sensitivity and the resolving power and, in particularly, show the less layer thickness reliance of the performance thereof, form no development residue, and are excellent in the storage stability.

While the invention has been described in detail and with reference to specific embodiments thereof, it will be apparent to one skilled in the art that various changes and modifications can be made therein without departing from the spirit and scope thereof.

What is claimed is:

1. A positive photoresist composition comprising an alkali-soluble resin and as a photosensitive compound the 1,2-naphthoquinonediazido-5-(and/or -4-)sulfonic acid ester of a polyhydroxy compound represented by formula (I) or (II), wherein in a high-speed liquid chromatography measured using a ultraviolet ray of 254 nm, the pattern of the diester component and the pattern of the complete ester component of said 1,2-naphthoquinonediazido-5-(and/or -4-)sulfonic acid of the polyhydroxy compound shown by formula (I) or (II) are at least 50% and less than 40% respectively, of the whole pattern areas;

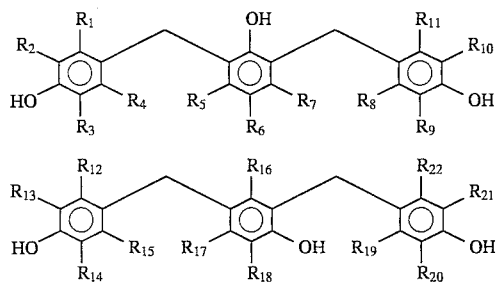

wherein $R_1$ to $R_{11}$, which may be the same or different, each represents a hydrogen atom, a halogen atom, an alkyl group, an alkoxy group, or a cycloalkyl group, with the proviso that at least one of $R_1$ to $R_{11}$ is a cycloalkyl group, and $R_{12}$ to $R_{22}$, which may be the same or different, each represents a hydrogen atom, a halogen atom, an alkyl group, an alkoxy group, or a cycloalkyl group, with the proviso that at least one of $R_{12}$ to $R_{22}$ is a cycloalkyl group.

2. A positive photoresist composition as in claim 1, wherein the polyhydroxy compound represented by formula (I) or (II) is selected from the group consisting of the following compounds [I-1] to [I-9] and [II-1] to [II-9]:

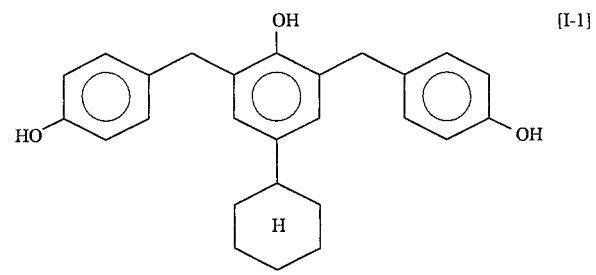

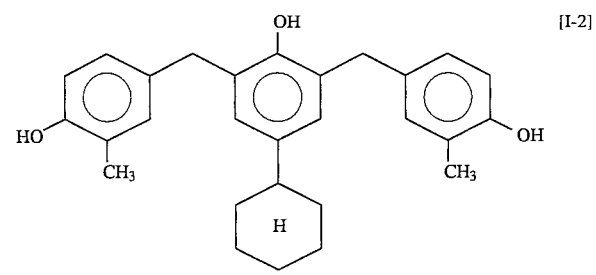

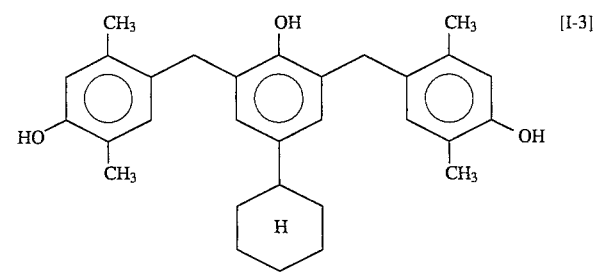

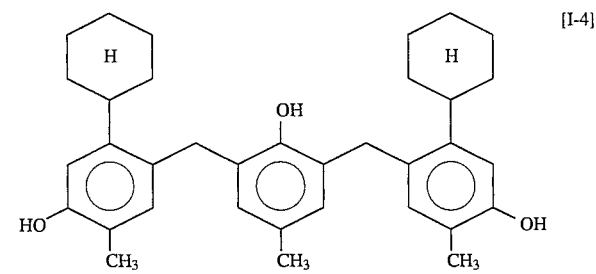

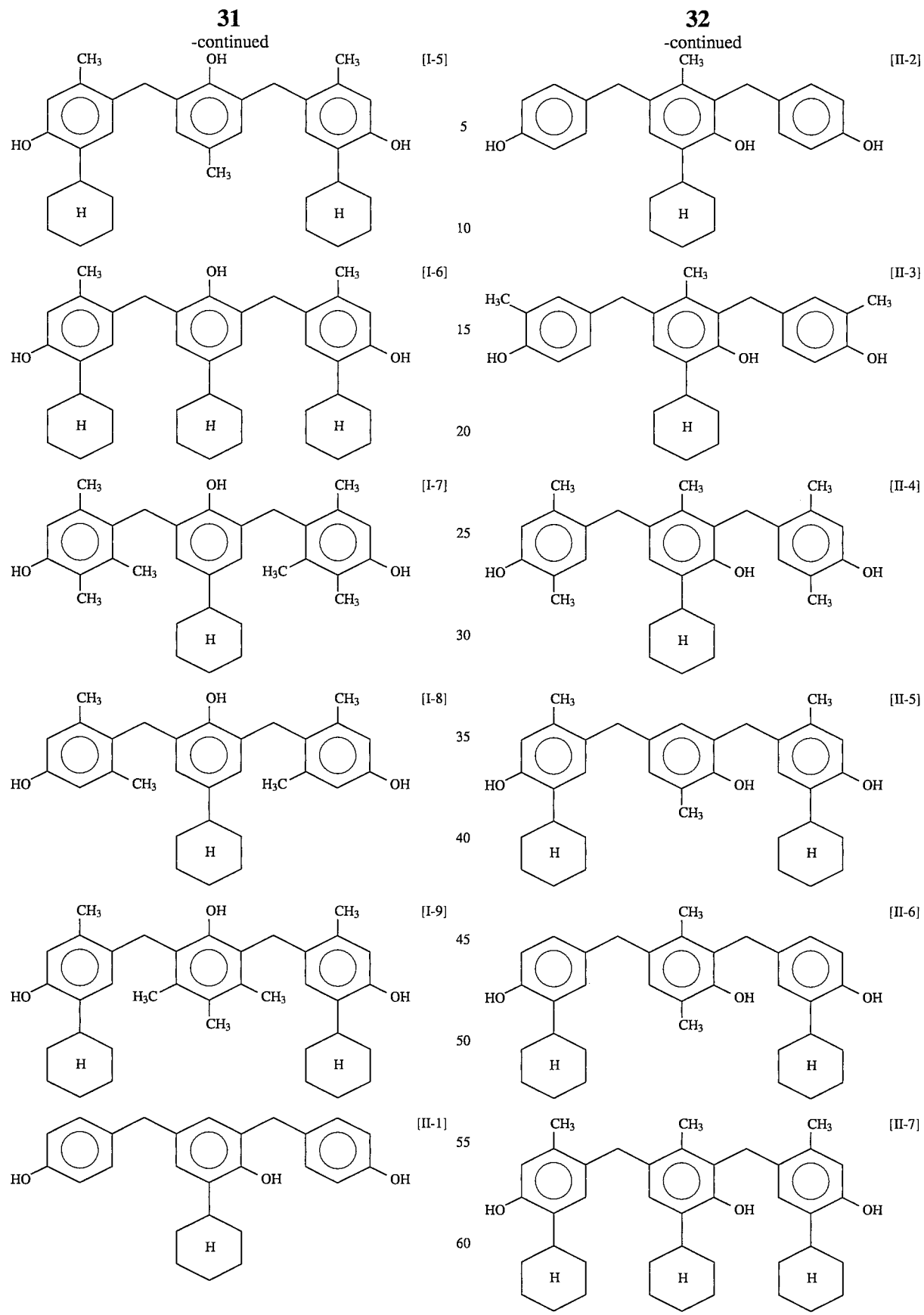

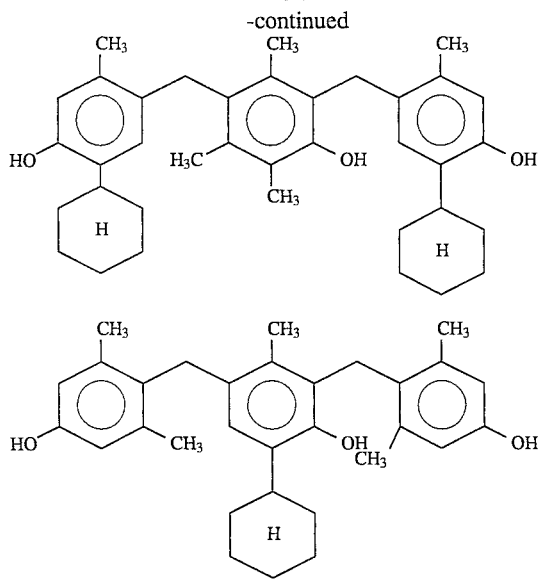

3. A positive photoresist composition as in claim 1, wherein the pattern of the diester component and the pattern of the complete ester component of said 1,2-naphthoquinonediazido- 5-(and/or -4-)sulfonic acid of the polyhydroxy compound shown by formula (I) or (II) are at least 60% and less than 30%, respectively, of the whole pattern areas.

4. A positive photoresist composition as in claim 1, wherein the pattern of the diester component and the pattern of the complete ester component of said 1,2-naphthoquinonediazido- 5-(and/or -4-)sulfonic acid of the polyhydroxy compound shown by formula (I) or (II) are at least 70% and less than 20%, respectively, of the whole pattern areas.

5. A positive photoresist composition as in claim 1, wherein the compounding amount of the photosensitive compound is from 5 to 100 parts by weight per 100 parts by weight of the alkali-soluble resin.

6. A positive photoresist composition as in claim 1, wherein the compounding amount of the photosensitive compound is from 20 to 60 parts by weight per 100 parts by weight of the alkali-soluble resin.

7. A positive photoresist composition as in claim 1, wherein the alkali-soluble resin is a novolac resin.

8. A positive photoresist composition as in claim 1, further comprising a polyhydroxy compound.

* * * * *